(12) United States Patent
Boroson et al.

(10) Patent No.: US 7,129,634 B2
(45) Date of Patent: Oct. 31, 2006

(54) COLOR OLED WITH ADDED COLOR GAMUT PIXELS

(75) Inventors: Michael L. Boroson, Rochester, NY (US); Dustin L. Winters, Webster, NY (US); Yuan-Sheng Tyan, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 251 days.

(21) Appl. No.: 10/819,697

(22) Filed: Apr. 7, 2004

(65) Prior Publication Data

US 2005/0225232 A1    Oct. 13, 2005

(51) Int. Cl.
*H01J 1/62* (2006.01)
*H01J 63/04* (2006.01)

(52) U.S. Cl. ...................................... 313/504; 313/506

(58) Field of Classification Search ................ 313/498, 313/503–506, 512, 113, 114; 315/169.3; 428/917; 345/36, 45, 76

See application file for complete search history.

(56) References Cited

U.S. PATENT DOCUMENTS

| | | | |
|---|---|---|---|
| 4,356,429 A | 10/1982 | Tang | |
| 4,769,292 A | 9/1988 | Tang et al. | |
| 4,885,211 A | 12/1989 | Tang et al. | |
| 5,276,380 A | 1/1994 | Tang | |
| 5,405,709 A | 4/1995 | Littman et al. | |
| 5,550,066 A | 8/1996 | Tang et al. | |
| 5,683,823 A | 11/1997 | Shi et al. | |
| 6,281,634 B1 | 8/2001 | Yokoyama | |
| 6,392,340 B1 | 5/2002 | Yoneda et al. | |
| 6,456,013 B1 | 9/2002 | Komiya et al. | |
| 6,570,584 B1 | 5/2003 | Cok et al. | |
| 2002/0186214 A1 | 12/2002 | Siwinski | |
| 2003/0107314 A1 | 6/2003 | Urabe et al. | |
| 2004/0113875 A1* | 6/2004 | Miller et al. | ............... 345/82 |

FOREIGN PATENT DOCUMENTS

| | | |
|---|---|---|
| EP | 0 616 488 | 9/1994 |
| EP | 0 683 623 | 11/1995 |
| GB | 2 349 979 | 11/2000 |
| JP | 07-142169 | 6/1995 |
| WO | WO 00/11728 | 3/2000 |

OTHER PUBLICATIONS

Patent Abstracts of Japan vol. 2003, No. 10, Oct. 8, 2003 & JP 2003 178875 (Asahi Glass Co. Ltd) Jun. 27, 2003.

* cited by examiner

*Primary Examiner*—Joseph Williams
*Assistant Examiner*—Bumsuk Won
(74) *Attorney, Agent, or Firm*—Raymono L. Owens (57) ABSTRACT

An OLED device includes an array of light-emitting pixels having organic layers, including at least one emissive layer that produces light and spaced electrodes, and wherein at least three pixels produce colors which define a color gamut and at least one pixel produces light within the color gamut, and wherein the at least one pixel within the color gamut includes a reflector and a semitransparent reflector which function to form a microcavity.

28 Claims, 9 Drawing Sheets

COLOR OLED WITH ADDED COLOR GAMUT PIXELS

CROSS REFERENCE TO RELATED APPLICATIONS

Reference is made to commonly assigned U.S. patent application Ser. No. 10/820,570 filed concurrently herewith by Michael L. Boroson et al., entitled "OLED With Color Change Media", the disclosure of which is herein incorporated by reference.

FIELD OF THE INVENTION

The present invention relates to organic electroluminescent (EL) devices. More specifically, this invention relates to a multicolor emitting EL device with improved stability, efficiency, and color purity.

BACKGROUND OF THE INVENTION

Full color organic electroluminescent (EL), also known as organic light-emitting devices (OLED), have been demonstrated recently as a new type of flat panel display. OLED devices are attractive because of their low driving voltage, high luminance, wide-angle viewing, and capability for full color flat emission displays. In simplest form, an organic EL device is comprised of an anode for hole injection, a cathode for electron injection, and an organic EL medium sandwiched between these electrodes to support charge recombination that yields emission of light. An example of an organic EL device is described in commonly assigned U.S. Pat. No. 4,356,429. Other examples have been described by Tang, et al. in U.S. Pat. Nos. 4,769,292 and 4,885,211. In order to construct a pixilated display device that is useful, for example as a television, computer monitor, cell phone display or digital camera display, individual organic EL elements can be arranged as an array of pixels in a matrix pattern. This matrix of pixels can be electrically driven using either a simple passive matrix or an active matrix driving scheme. In a passive matrix, the organic EL layers are sandwiched between two sets of orthogonal electrodes arranged in rows and columns. An example of a passive-matrix-driven organic EL device is disclosed in commonly assigned U.S. Pat. No. 5,276,380. In an active matrix configuration, each pixel is driven by multiple circuit elements such as transistors, capacitors, and signal lines. Examples of such active matrix organic EL devices are provided in U.S. Pat. No. 5,550,066 (commonly assigned); U.S. Pat. Nos. 6,281,634; and 6,456,013.

Full color OLED devices are also known in the art. Typical full color OLED devices are constructed of three different color pixels that are red, green, and blue in color. Such an arrangement is known as an RGB design. An example of an RGB design is disclosed in U.S. Pat. No. 6,281,634. Full color organic electroluminescent (EL) devices have also recently been described that are constructed of four different color pixels that are red, green, blue, and white. Such an arrangement is known as an RGBW design. An example of an RGBW device is disclosed in commonly assigned U.S. patent application Publication 2002/0186214 A1. In an RGBW device, high efficiency white-emitting pixels are used to display a portion of the digital image content. This results in improved power consumption relative to an RGB constructed of similar OLED materials.

A white-emitting electroluminescent (EL) layer can be used to form a multicolor device. Each pixel is coupled with a color filter element as part of a color filter array (CFA) to achieve a pixilated multicolor display. The organic EL layer is common to all pixels and the final color as perceived by the viewer is dictated by that pixel's corresponding color filter element. Therefore, a multicolor or RGB device can be produced without requiring any patterning of the organic EL layers. An example of a white CFA top-emitting device is shown in U.S. Pat. No. 6,392,340. Other examples of white-light-emitting OLED devices are disclosed in U.S. Pat. No. 5,683,823, JP 07-142169, and U.S. Pat. No. 5,405,709.

Numerous OLEDs with alternative layer structures, including polymeric materials, have been disclosed, and device performance has been improved. For the commercial success of OLEDs, further improvement in devices is needed. Among the key areas that need further improvement are the efficiency and operating stability of the devices. It is also desirable to improve the color gamut obtainable from such devices.

SUMMARY OF THE INVENTION

It is therefore an object of the present invention to provide an OLED device with improved efficiency and longer lifetime.

It is a further object of the present invention to provide an OLED device with an improved color gamut.

This object is achieved by an OLED device comprising:

a) an array of light-emitting pixels having organic layers, including at least one emissive layer that produces light and spaced electrodes, and wherein at least three pixels produce colors which define a color gamut and at least one pixel produces light within the color gamut; and b) wherein the at least one pixel within the color gamut includes a reflector and a semitransparent reflector which function to form a microcavity.

Advantages

It is an advantage of the present invention that it provides improved device efficiency with lower power consumption and longer lifetime. It is a further advantage for some embodiments of the present invention that such a device can be constructed using common OLED organic layers for all pixels which does not require precision patterning of organic materials to form the pixels. Any device patterning necessary can be done as part of the formation of the active matrix components or passive matrix components by photolithographic methods, which are more precise methods than those commonly used to deposit organic layers. It is a further advantage for some embodiments of the present invention that such a device can be constructed without the need for color filter elements, which thereby lowers cost. It is a further advantage for some embodiments of the present invention that an improved or extended color gamut is provided. This configuration permits for an RGBW (red, green, blue, and white) or RGBX (red, green, blue, and at least one additional color) configuration to be used in a top-emitting device with a highly conductive cathode that does not require patterning.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "OLED device" or "organic light-emitting display" is used in its art-recognized meaning of a display device comprising organic light-emitting diodes as pixels. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of emitting in several regions of the visible spectrum and therefore displaying images in a large combination of hues. The red, green, and blue colors constitute the three primary colors from which all other colors can be produced by appropriate mixing. However, for this invention, full color can include additional different color pixels whose purpose will become clear. The term "hue" refers to the intensity profile of light emission within the visible spectrum, with different hues exhibiting visually discernible differences in color. The term "pixel" is employed in its art-recognized usage to designate an area of a display panel that can be stimulated to emit light independently of other areas. However, it is recognized that in full color systems, several pixels of different colors will be used together to produce a broad range of colors, and a viewer can term such a group a single pixel. For the purposes of this invention, such a logical grouping will be termed a group of pixels or a pixel group. For example, in a three-color RGB full color display, a group of pixels generally comprises three primary-color pixels, namely red, green, and blue (RGB), which are color-gamut-defining pixels.

Figure 1A:
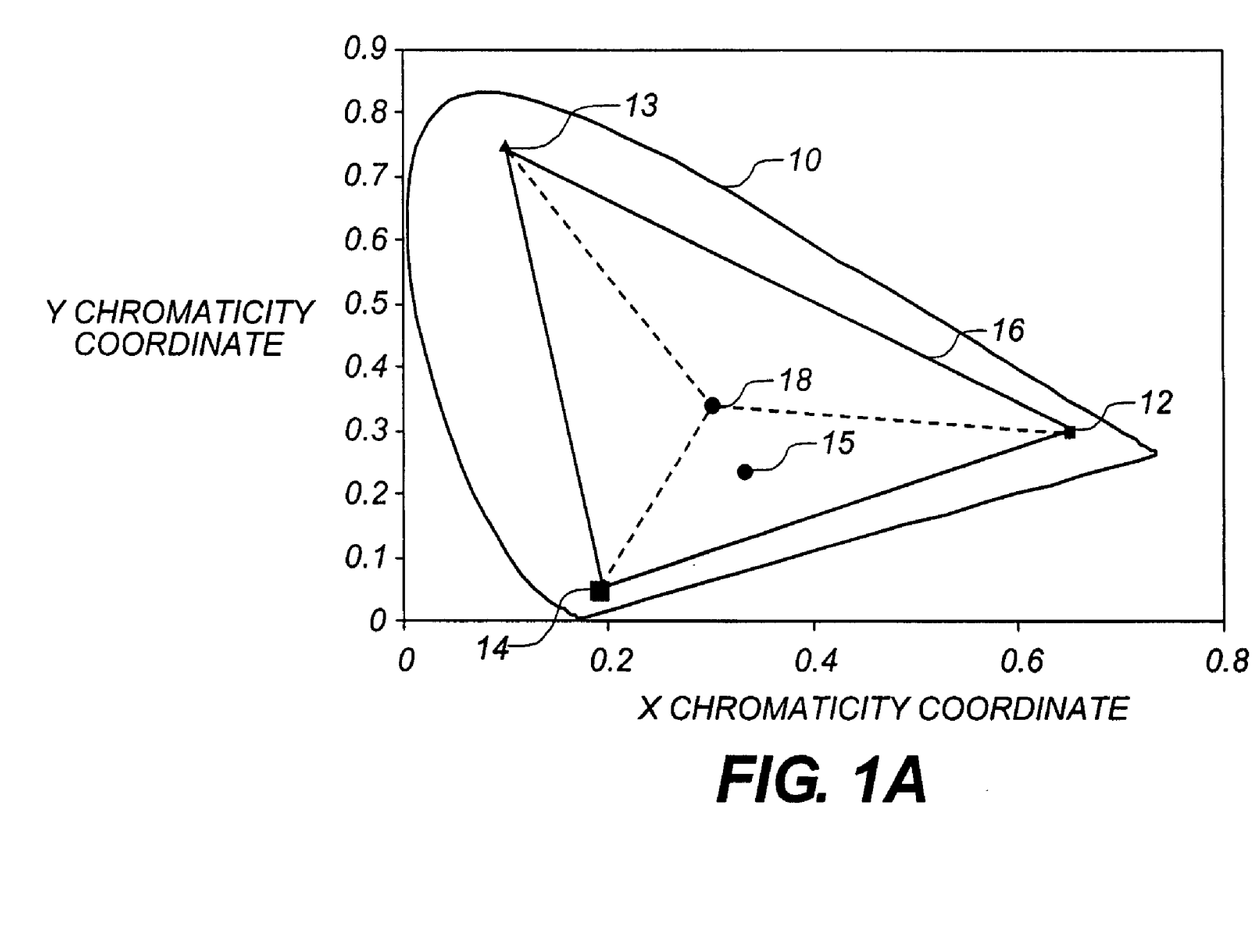
FIG. 1A shows a 1931 CIE (Commission Internationale d'Éclairage) x,y-chromaticity diagram of a light-emitting device with three color-gamut-defining pixels and one within-gamut pixel.

It is sometimes useful to form displays comprising pixels of more than three different colors. The added color pixels can emit a color within the gamut defined by the other pixels, or can emit a color outside the gamut defined by the other pixels. RGBW displays are one example of a type of display that utilizes within-gamut emission to improve power consumption. FIG. 1A shows a 1931 CIE (Commission Internationale d'Éclairage) x,y-chromaticity diagram of a light-emitting device with three color-gamut-defining pixels and one within-gamut pixel. At least three pixels emit different colors, e.g. red emitter 12, green emitter 13, and blue emitter 14, which define the color gamut 16 of the display in CIE color space 10. By illuminating two or more of the color-gamut-defining pixels to varying intensities, other colors can be produced. These new colors are within-gamut colors. Such a display device also has at least one additional pixel that emits a within-gamut color light, e.g. white emitter 18. The term white is used in the present invention to indicate any light emission which is perceived as approximately white to a viewer. The within-gamut pixel, however can be any color within the gamut of the color-gamut-defining pixels, and the term RGBW is used herein to describe any display having at least three color-gamut-defining pixels and at least one within-gamut pixel. This type of display is more efficient than conventional OLED displays because the within-gamut pixels tend to have higher efficiency than at least one of the color-gamut-defining pixels. Typically, the within-gamut pixel is more efficient than all of the color-gamut-defining pixels. Each pixel can be fabricated using a separate OLED material designed to emit a different color light. However, a frequently-used configuration uses a common broadband or white-emitting OLED material common to all pixels. The use of a broadband or white-emitting OLED material limits the need to pattern the OLED materials for each pixel. In this case, color filters can be used for some of the pixels to convert a broadband or white emission to individual colors. For example, red, green, and blue color filters can be used in the color-gamut-defining pixels of RGBW devices to form red, green, and blue colors. The within-gamut pixel is left unfiltered to emit white light, and therefore is more efficient than the color-gamut-defining pixels.

In this configuration, the added emitter produces a series of sub-gamuts (shown by the dashed lines in FIG. 1A) comprising white emitter 18 and two of the other three emitters. The sub-gamuts together form color gamut 16. Thus, while one can produce a desired color 15 from an appropriate combination of red emitter 12, green emitter 13, and blue emitter 14, it can be more efficient to produce it by an appropriate combination of red emitter 12, blue emitter 14, and white emitter 18.

Figure 1B:
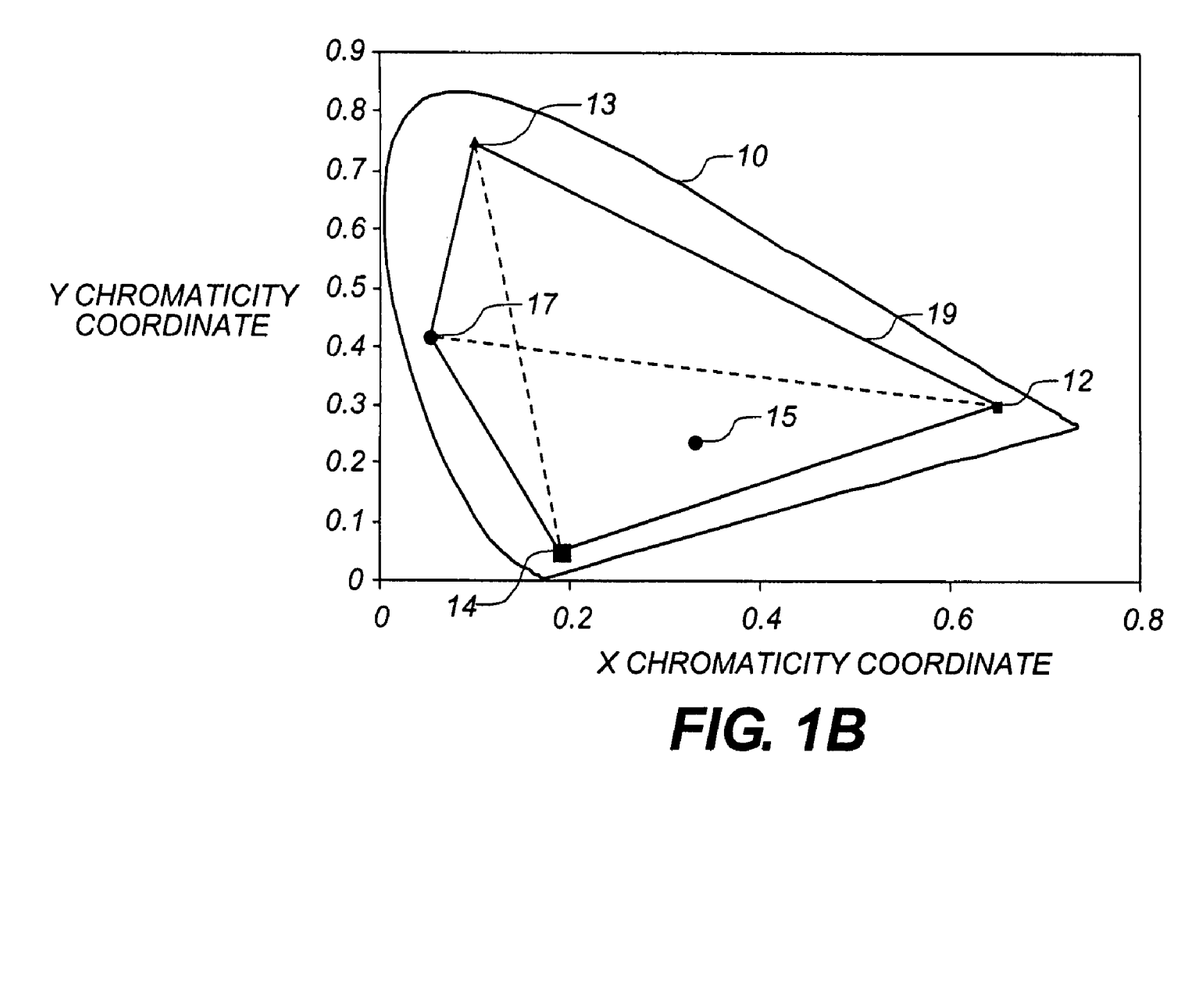
FIG. 1B shows a 1931 CIE x,y-chromaticity diagram of a light-emitting device with four color-gamut-defining pixels.
Figure 2A:
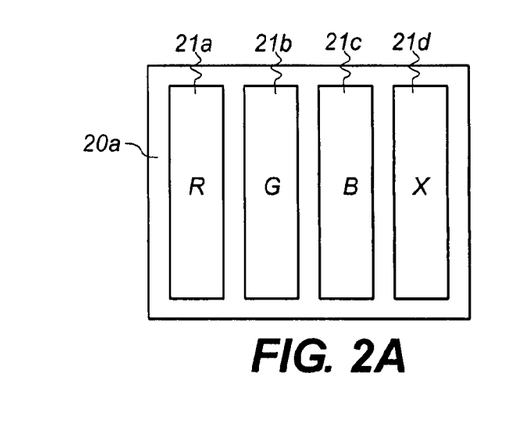
FIGS. 2A through 2D depict some pixel configurations that can be used in accordance with the present invention.
Figure 2B:
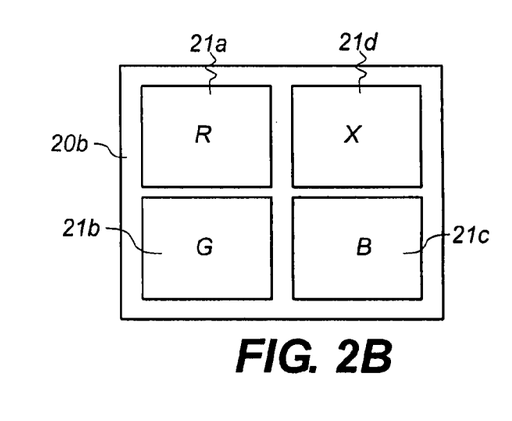
Figure 2C:
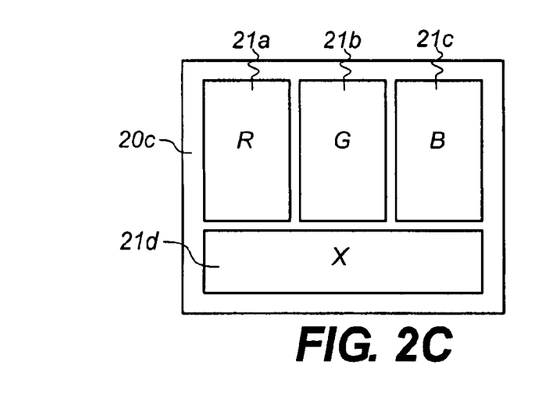
Figure 2D:
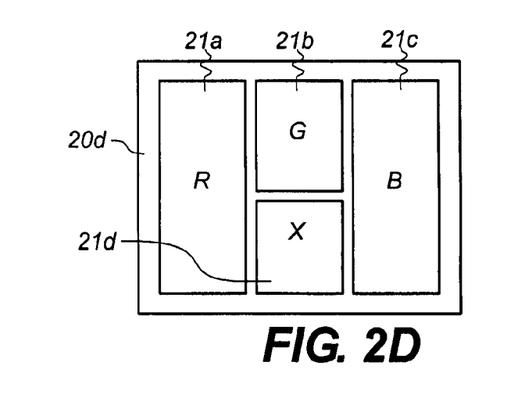

FIG. 1B shows a 1931 CIE x,y-chromaticity diagram of a light-emitting device with four color-gamut-defining pixels. This is an example of a display with added color-gamut-defining pixels in what can be called an RGBC device. Besides red emitter 12, green emitter 13, and blue emitter 14, such a device includes cyan emitter 17, which emits outside the color gamut defined by the other three pixels. Such a device has the advantage that it can define an extended color gamut 19.

In this configuration, the added emitter produces a series of sub-gamuts (shown by the dashed lines of FIG. 1B) comprising three of the four emitters. Each sub-gamut overlaps with others. Thus, one can produce a desired color 15 from an appropriate combination of red emitter 12, green emitter 13, and blue emitter 14; or an appropriate combination of red emitter 12, cyan emitter 17, and blue emitter 14; or an appropriate combination of all four emitters.

For the purposes of this invention, devices such as those above will generally be referred to as RGBX devices, where X refers to a fourth color pixel that can be within the color gamut defined by the other pixels, or can itself be color-gamut-defining. Patterns of more than four pixels can also be included, and can include both within-gamut pixels and added color-gamut-defining pixels. Furthermore, although red, green, and blue pixels are commonly used in OLED devices, it will be understood that any combination of three color-gamut-defining pixels can be used to provide desirable properties in a given device.

FIG. 2 illustrates example pixel configurations that can be used for an OLED device according to this invention. FIG. 2A shows a stripe pattern configuration of a device with group of pixels 20a. Group of pixels 20a includes color-gamut-defining pixels 21a, 21b, and 21c as well as extra pixel 21d, which can be a within-gamut pixel or can be a color-gamut-defining pixel. FIG. 2B shows a quad pattern configuration of a device with group of pixels 20b. FIG. 2C shows another pattern configuration of a device with group of pixels 20c. FIG. 2D shows another pattern configuration of a device with group of pixels 20d. Other patterns can also be applied to the present invention, including patterns with more than 4 pixels. While in the above-mentioned examples, the pixels are shown to be arranged in a certain order, the pixels can be arranged in other embodiments having different orders, and other embodiments can have pixels with differing sizes and shapes.

Figure 3:
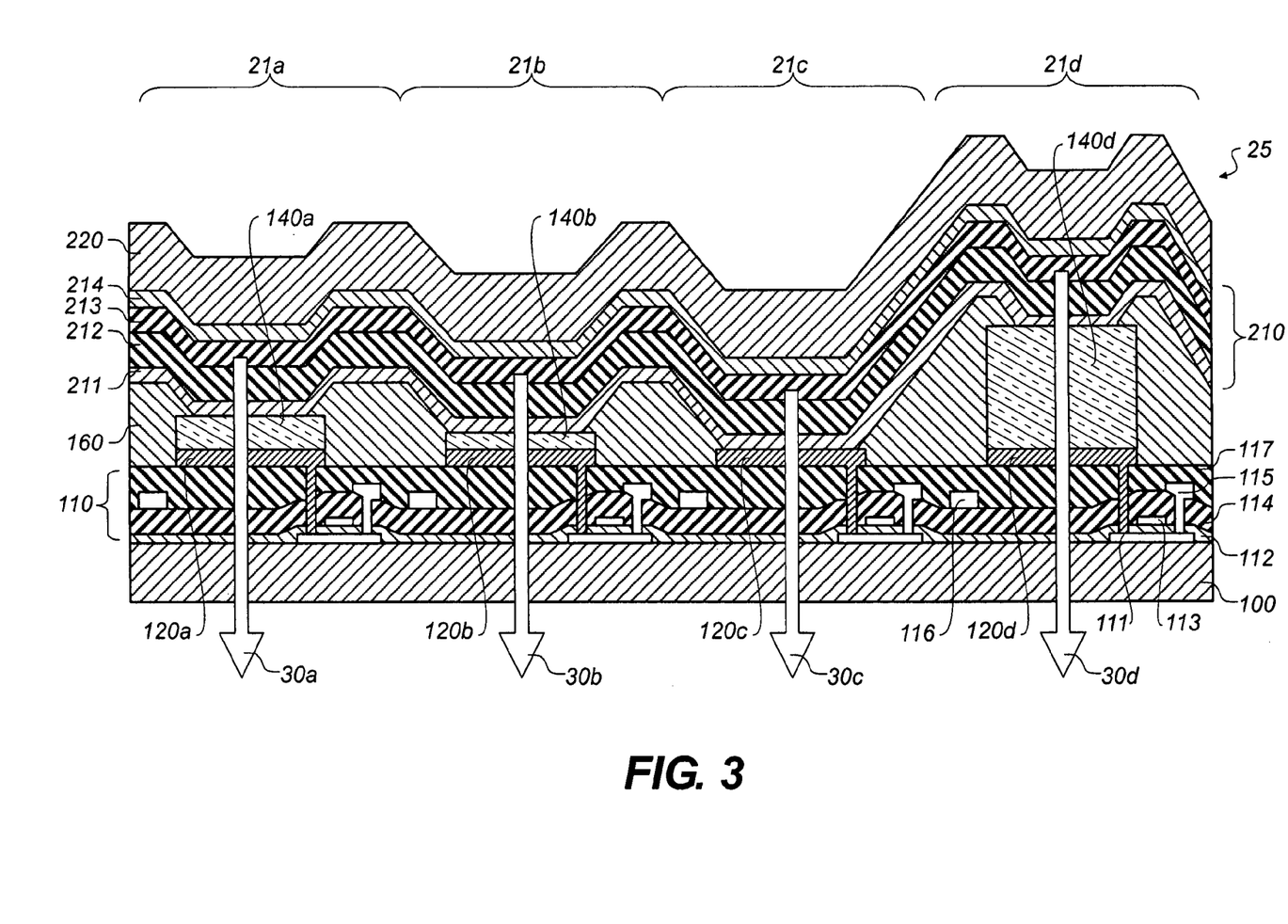
FIG. 3 depicts a cross-sectional view of an array of light-emitting pixels according to an embodiment of the present invention.

FIG. 3 shows a cross-sectional view of an array of light-emitting pixels of an OLED device 25 according to the present invention having, for example, a stripe pattern with three pixels 21a, 21b, and 21c that produce colors which define a color gamut, and at least one additional pixel 21d which can produce light within the color gamut or can produce a fourth color which further defines a color gamut. The pixels have organic layers 210, including at least one emissive layer 213 that produces light, and spaced electrodes whose nature will become evident. These pixels emit light 30a, 30b, 30c, and 30d, respectively. OLED device 25 shown in FIG. 3 is an active matrix device with active matrix circuitry 110. Alternate embodiments wherein OLED device 25 is a passive matrix device and does not have active matrix circuitry can be applied to the present invention. FIG. 3 also shows a configuration that is bottom-emitting, that is, where light (30a, 30b, 30c, and 30d) is emitted from OLED device 25 in the direction of substrate 100.

OLED device 25 includes reflector 220, which is a material that is highly reflective at the wavelengths at which OLED device 25 emits light. Preferred materials for reflector 220 that are highly reflective include Ag, Al, Au, or alloys composed of one or more of these materials. Pixel 21d also includes semitransparent reflector 120d, which is partially reflective and partially transmissive. Preferred materials for semitransparent reflector 120d include Ag, Au, or alloys composed of one or both of these materials, in a thickness selected to cause them to be semitransparent, that is, partially transmitting and partially reflective. This thickness can be in the range of, for example, between 5 nm and 50 nm, and is more preferably between 15 nm and 30 nm. An alternate semitransparent reflector structure composed of a quarter wave stack (QWS) of transparent materials with alternating high and low refractive indexes is also known and can be applied to the present invention by someone skilled in the art. In a bottom-emitting device, such as shown, where the light is viewed through substrate 100, semitransparent reflector 120d is located between organic layers 210 and substrate 100, and reflector 220 is located above substrate 100, semitransparent reflector 120d, and organic layers 210. Alternately, in a top-emitting device, that is where the light is viewed in the direction opposite substrate 100, reflector 220 is located between the organic layers 210 and substrate 100, and semitransparent reflector 120d is located above substrate 100, reflector 220, and organic layers 210.

Reflector 220 and semitransparent reflector 120d function, with the layers between them, to form a microcavity, which can be adjusted in thickness and refractive index to resonate at a desired wavelength. Examples of microcavity structures are shown in U.S. Pat. No. 6,406,801; U.S. Patent Application Publication 5,780,174 A1; and JP 11288786.

OLED device 25 includes spaced electrodes for each of the pixels. If conductive material is used to form reflector 220 or semitransparent reflector 120d, then reflector 220, semitransparent reflector 120d, or both, can also function as an electrode, either the anode or the cathode, for the organic EL medium. In OLED device 25, semitransparent reflector 120d functions as the bottom electrode for pixel 21d, and reflector 220 functions as the top electrode for all the pixels. Other configurations are possible wherein the semitransparent reflector is a common electrode for all pixels and there is a separate reflector for each pixel. Still other configurations are possible wherein the electrodes and the reflectors are separate entities. The bottom electrode, i.e. the one closest to substrate 100, is commonly the anode, but this invention is not limited to devices of that configuration.

Pixel 21d functions as a microcavity because light emitted by emissive layer 213 is reflected by reflector 220 and a portion of light is reflected by semitransparent reflector 120d. Typically the portion of light reflected is between 25% and 75%, and depends upon the thickness of the semitransparent reflector and the wavelength of the light. This leads to an enhancement of light 30d emitted by pixel 21d through semitransparent reflector 120d wherein certain wavelengths of light 30d will be enhanced. As is well known in the art, the distance between reflector 220 and semitransparent reflector 120d is an integral multiple of half the wavelength of enhanced light 30d corrected for phase shifts at the reflector surfaces. The thickness of organic layers 210 optimized for emission is not necessarily of the proper dimensions to provide the desired wavelength of light 30d, and it can be desirable to include transparent cavity-spacer layer 140d to obtain the desired dimensions. Transparent cavity-spacer layer 140d is formed above semitransparent reflector 120d. Transparent cavity-spacer layer 140d can be constructed of a metal oxide such as, but not limited to, indium-tin oxide (ITO), zinc-tin oxide (ZTO), tin oxide (SnOx), indium oxide (InOx), molybdenum oxide (MoOx), tellurium oxide (TeOx), antimony oxide (SbOx), indium zinc oxide (IZO), and zinc oxide (ZnOx). The thickness of transparent cavity-spacer layer 140d, refractive index of transparent cavity-spacer layer 140d, or both, are adjusted in conjunction with the thickness and index of refraction of organic layers 210 in order to tune the microcavity to resonate at the wavelength for the desired color of light for pixel 21d. Tuning thickness and refractive index to achieve the desired microcavity emission is well known in the art.

In this case, transparent cavity-spacer layer 140d also serves as an electrode for the organic layers 210 so that transparent cavity-spacer layer 140d must be electrically connected down to the active matrix components. This can be achieved directly if transparent cavity-spacer layer 140d is of a transparent conducting material such as a number of the metal oxides above. If transparent cavity-spacer layer 140d is not conductive, a transparent electrode, transparent cavity-spacer layer 140d, and semitransparent reflector 120d can be formed of three (or more) different layers in a way in which the transparent electrode would be in electrical contact with the active matrix circuitry and transparent cavity-spacer layer 140d would be between the transparent electrode and semitransparent reflector 120d. The transparent electrode can be constructed of a metal oxide such as, but not limited to, indium-tin oxide (ITO), zinc-tin oxide (ZTO), tin oxide (SnOx), indium oxide (InOx), molybdenum oxide (MoOx), tellurium oxide (TeOx), antimony oxide (SbOx), and zinc oxide (ZnOx).

While transparent cavity-spacer layer 140d is shown here as being between semitransparent reflector 120d and organic layers 210, in alternate embodiments transparent cavity-spacer layer 140d can be formed between organic layers 210 and reflector 220.

In another alternate embodiment, where one or more of organic layers 210 are not common to all pixels but are instead individually patterned for each pixel, then the transparent cavity-spacer layers can be limited, and the microcavity for the color-gamut-defining pixels can be tuned by separately tuning the thickness, refractive index, or both, of one or more of organic layers 210 for each color-gamut-defining pixel. If organic layers 210 are designed to emit broadband (e.g. white) light, it can be preferable to use the same thickness for one or more of the organic layers 210 for the within-gamut pixels and one or more of the color-gamut-defining pixels to reduce the number of deposition steps.

Pixel 21d can be a within-gamut pixel, e.g. emitter 18 in FIG. 1A. In such a case, it is desirable that the microcavity formed by reflector 220, semitransparent reflector 120d, and the intervening layers be a multimode microcavity. By multimode microcavity, it is meant that the thickness and index of refraction of the layers of pixel 21d are such that more than one wavelength of light is selectively enhanced. Multimode microcavities occur when two or more wavelengths are simultaneously enhanced by a microcavity. The optical thickness of the microcavity is tuned to resonate at approximately an integer multiple of half wavelengths of a first wavelength and a different integer multiple of half wavelengths of a second wavelength, etc. For example, Xu, et al. in U.S. Pat. No. 6,133,692 show a system in which a microcavity with an effective optical length of 1590 nm will selectively enhance broad-spectrum light to produce peaks at 454 nm (blue), 530 nm (green), and 636 nm (red), which can collectively be used to form white. Multimode microcavities are also described in U.S. Pat. Nos. 5,478,658 and 5,674,636. When pixel 21d is a within-gamut pixel, a useful combination is achieved wherein the colors produced by color-gamut-defining pixels 21a, 21b, and 21c are red, green, and blue, and the color produced by within-gamut pixel 21d is white. Although not shown, one or more of color-gamut-defining pixels 21a, 21b, and 21c can include a color filter element to further improve the colors of the color-gamut-defining pixels.

Although it has been found useful that pixel 21d be a microcavity, it can be desirable that one or more of the color-gamut-defining pixels 21a, 21b, and 21c further comprise a reflector and a semitransparent reflector which function to form a microcavity. This can be achieved with reflector 220 and one or more semitransparent reflectors 120a, 120b, and 120c. Color-gamut-defining pixel 21a is constructed using transparent cavity-spacer layer 140a above semitransparent reflector 120a. The thickness and index of refraction of transparent cavity-spacer layer 140a is optimized in conjunction with the thickness and index of refraction of the organic layers 210 in order to tune the microcavity to resonate at a different wavelength for the desired color of light for pixel 21a, for example, red. A similar construction is used for pixel 21b with transparent cavity-spacer layer 140b to produce the desired color of that pixel, for example, green. When more than one pixel includes a microcavity and transparent cavity-spacer layer, the thickness of the transparent cavity-spacer layer, refractive index of the transparent cavity-spacer layer, or both, are separately adjusted for each differently colored pixel. Such a construction permits OLED device 25 to be formed using organic layers 210 that produce broadband emission (e.g. white light) and are common to all pixels, thus limiting the need to pattern organic layers 210.

Color-gamut-defining pixel 21c is shown here as not having a transparent cavity-spacer layer, that is, where all but one of the pixels having a reflector and semitransparent reflector further include a transparent cavity-spacer layer. In this case, only the thickness and index of refraction of organic layers 210 are optimized in order to tune the cavity to resonate at a different wavelength for the desired color of light for pixel 21c, for example, blue. If organic layers 210 produce broadband emission (e.g. white) and are common to all pixels, as shown, then organic layers 210 are optimized only for color-gamut-defining pixel 21c, and the other color-gamut-defining pixels are separately tuned using their respective transparent cavity-spacer layers. This configuration reduces the number of different transparent cavity-spacer layers which need to be deposited and patterned. In an alternate embodiment, all pixels having a reflector and semitransparent reflector, including pixel 21c, can further include a transparent cavity-spacer layer with each separately adjusted to tune the respective microcavities to the desired colors. Use of a transparent cavity-spacer layer in at least some pixels is preferred to permit the organic layers 210 to be deposited without patterning for each pixel. In another alternate embodiment, one or more of organic layers 210 can be separately patterned and adjusted in thickness or refractive index for one or more of the pixels to tune the microcavity of each of the color-gamut-defining pixels. In this configuration, a transparent cavity-spacer layer can be used or limited. However, this requires precision patterning of at least one of the organic layers. In another embodiment, one or more of the color-gamut-defining pixels 21a, 21b, or 21c can include a color filter element, which will be further described below.

Pixel 21d can be a color-gamut-defining pixel, e.g. emitter 17 in FIG. 1B. That is, the array of light-emitting pixels includes at least four pixels that produce colors which define a color gamut. A useful combination can be achieved wherein pixels 21a, 21b, and 21c are red, green, and blue, and where pixel 21d can be chosen from a color to extend the color gamut, e.g. yellow, cyan, or magenta. At least one of pixels 21a, 21b, 21c, or 21d comprises a reflector and a semitransparent reflector which function to form a microcavity. In one embodiment, pixel 21d can have an effective thickness to enhance a single wavelength of light, such as a blue-green (cyan) wavelength. This can be emitter 17 in FIG. 1A, which would extend the color gamut and would be more efficient than a non-microcavity pixel. In another embodiment, pixel 21d can have an effective thickness to be a multimode microcavity, which can selectively enhance two wavelengths of light. If these wavelengths are chosen to be different from the wavelengths emitted by pixels 21a, 21b, and 21c, it is possible to produce an emission that extends the color gamut. In another embodiment, one or more of pixels 21a, 21b, 21c, or 21d include a color filter element which will be further described below.

The OLED device of this invention and the pixels therein are typically disposed as shown over a supporting substrate 100. Substrate 100 can either be light transmissive or opaque, depending on the intended direction of light emission. The light transmissive property is desirable for viewing the EL emission through substrate 100. Transparent glass or plastic is commonly employed in such cases. For applications where the EL emission is viewed through the top electrode, the transmissive characteristic of substrate 100 is immaterial, and therefore can be light transmissive, light absorbing, or light reflective. Substrates for use in this case include, but are not limited to, glass, plastic, semiconductor materials, silicon, ceramics, and circuit board materials.

The active matrix circuitry 110 is formed over substrate 100. Active matrix circuitry 110 includes a first thin film transistor (TFT) comprised of a semiconductor active layer 111, a gate dielectric 112, a gate conductor 113, a first insulating layer 114, and a second insulating layer 117. Active matrix circuitry 110 further includes one signal line 116 that carries the luminance signal and one power line 115 to supply power to the transistor. Methods of fabricating the TFT circuitry are well known in the art. While only a single transistor, signal line, and power line are shown for each pixel, typically, each pixel also has a second transistor (not shown) as well as a capacitor (not shown) and additional select lines (not shown). Many types of circuits having different numbers and configurations of circuit components are known in the art and it is understood that a wide variety of these circuits will work with this invention. Examples of active matrix configurations include U.S. Pat. Nos. 5,550,066; 6,281,634; and 6,501,466. While the TFTs shown are fabricated with a thin film semiconductor active layer 111, it is understood that with semiconducting substrates, substrate 100 can actually serve this function. FIG. 3 shows a top gate structure, that is, where the gate conductor 113 and the gate dielectric 112 are above the semiconductor active layer 111. However, it is also known in the art that TFTs with an inverse structure known as bottom gate can be used to drive organic EL devices.

An interpixel dielectric layer 160, as described in U.S. Pat. No. 6,246,179, can be used to cover the edges of the transparent or semitransparent electrodes (e.g. semitransparent reflector 120d) to prevent shorts or strong electric fields in this area. The interpixel dielectric layer 160 can also cover the transparent cavity-spacer layer (e.g. 140d) as shown if the transparent cavity-spacer layer is conductive or forms part of the electrode. While use of the interpixel dielectric layer 160 is preferred, it is not required for successful implementation of the present invention.

OLED device 25 further includes organic layers 210. There are numerous configurations of the organic layers 210 known in the art wherein the present invention can be successfully practiced. For example, organic layers 210 can include e.g. hole-injecting layer 211, hole-transporting layer 212, emissive layer 213, and electron-transporting layer 214.

While not always necessary, it is often useful to provide a hole-injecting layer 211. Hole-injecting layer 211 can serve to improve the film formation property of subsequent organic layers and to facilitate hole injection into hole-transporting layer 212. Suitable materials for use in hole-injecting layer 211 include, but are not limited to, porphyrinic compounds as described in U.S. Pat. No. 4,720,432, plasma-deposited fluorocarbon polymers as described in U.S. Pat. Nos. 6,127,004, 6,208,075 and 6,208,077, and some aromatic amines, for example, m-MTDATA (4,4',4"-tris[(3-methylphenyl)phenylamino]triphenyl-amine). Alternative hole-injecting materials for organic EL devices are described in EP 0 891 121 A1 and EP 1 029 909 A1.

Hole-transporting layer 212 contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel, et al. U.S. Pat. No. 3,180,730. Other suitable triarylamines substituted with one or more vinyl radicals and/or comprising at least one active-hydrogen-containing group are disclosed by Brantley, et al. U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Hole-transporting layer 212 can be formed of a single or a mixture of aromatic tertiary amine compounds. Illustrative of useful aromatic tertiary amines are the following:

1,1-Bis(4-di-p-tolylaminophenyl)cyclohexane;
1,1-Bis(4-di-p-tolylaminophenyl)-4-phenylcyclohexane;
N,N,N',N'-tetraphenyl-4,4'''-diamino-1,1':4', 1":4",1"'-quaterphenyl;
Bis(4-dimethylamino-2-methylphenyl)phenylmethane;
1,4-bis[2-[4-[N,N-di(p-toly)amino]phenyl]vinyl]benzene (BDTAPVB);
N,N,N',N'-Tetra-p-tolyl-4,4'-diaminobiphenyl;
N,N,N',N'-Tetraphenyl-4,4'-diaminobiphenyl;
N,N,N',N'-tetra-1-naphthyl-4,4'-diaminobiphenyl;
N,N,N',N'-tetra-2-naphthyl-4,4'-diaminobiphenyl;
N-Phenylcarbazole;
4,4'-Bis[N-(1-naphthyl)-N-phenylamino]biphenyl (NPB);
4,4'-Bis[N-(1-naphthyl)-N-(2-naphthyl)amino]biphenyl (TNB);
4,4'-Bis[N-(1-naphthyl)-N-phenylamino]p-terphenyl;
4,4'-Bis[N-(2-naphthyl)-N-phenylamino]biphenyl;
4,4'-Bis[N-(3-acenaphthenyl)-N-phenylamino]biphenyl;
1,5-Bis[N-(1-naphthyl)-N-phenylamino]naphthalene;
4,4'-Bis[N-(9-anthryl)-N-phenylamino]biphenyl;
4,4'-Bis[N-(1-anthryl)-N-phenylamino]-p-terphenyl;
4,4'-Bis[N-(2-phenanthryl)-N-phenylamino]biphenyl;
4,4'-Bis[N-(8-fluoranthenyl)-N-phenylamino]biphenyl
4,4'-Bis[N-(2-pyrenyl)-N-phenylamino]biphenyl;
4,4'-Bis[N-(2-naphthacenyl)-N-phenylamino]biphenyl;
4,4'-Bis[N-(2-perylenyl)-N-phenylamino]biphenyl;
4,4'-Bis[N-(1-coronenyl)-N-phenylamino]biphenyl;
2,6-Bis(di-p-tolylamino)naphthalene;
2,6-Bis[di-(1-naphthyl)amino]naphthalene;
2,6-Bis[N-(1-naphthyl)-N-(2-naphthyl)amino]naphthalene;
N,N,N',N'-Tetra(2-naphthyl)-4,4"-diamino-p-terphenyl;
4,4'-Bis{N-phenyl-N-[4-(1-naphthyl)-phenyl] amino}biphenyl;
2,6-Bis[N,N-di(2-naphthyl)amino]fluorene;
4,4',4"-tris[(3-methylphenyl)phenylamino]triphenylamine (MTDATA); and
4,4'-Bis[N-(3-methylphenyl)-N-phenylamino]biphenyl (TPD).

Another class of useful hole-transporting materials includes polycyclic aromatic compounds as described in EP 1 009 041. Tertiary aromatic amines with more than two amine groups can be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

As more fully described in U.S. Pat. Nos. 4,769,292 and 5,935,721, emissive layer 213 includes a luminescent or fluorescent material where electroluminescence is produced as a result of electron-hole pair recombination in this region, producing light. Emissive layer 213 can be comprised of a single material, but more commonly includes a host material doped with a guest compound or compounds where light emission comes primarily from the dopant and can be of any color. The host materials in emissive layer 213 can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant can be added by copolymerizing a minor constituent into the host polymer.

An important relationship for choosing a dye as a dopant is a comparison of the bandgap potential, which is defined as the energy difference between the highest occupied molecular orbital and the lowest unoccupied molecular orbital of the molecule. For efficient energy transfer from the host to the dopant molecule, a necessary condition is that the bandgap of the dopant is smaller than that of the host material. For phosphorescent emitters it is also important that the host triplet energy level be high enough to enable energy transfer from host to dopant.

Host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine[alias, tris(8-quinolinolato)aluminum(III)];
CO-2: Magnesium bisoxine[alias, bis(8-quinolinolato)magnesium(II)];
CO-3: Bis[benzo{ft}-8-quinolinolato]zinc (II);
CO-4: Bis(2-methyl-8-quinolinolato)aluminum(III)-μ-oxo-bis(2-methyl-8-quinolinolato)aluminum(III);
CO-5: Indium trisoxine[alias, tris(8-quinolinolato)indium];
CO-6: Aluminum tris(5-methyloxine)[alias, tris(5-methyl-8-quinolinolato)aluminum(III)];
CO-7: Lithium oxine[alias, (8-quinolinolato)lithium(I)];
CO-8: Gallium oxine[alias, tris(8-quinolinolato)gallium (III)]; and
CO-9: Zirconium oxine[alias, tetra(8-quinolinolato)zirconium(IV)].

Other classes of useful host materials include, but are not limited to, derivatives of anthracene, such as 9,10-di-(2-naphthyl)anthracene and derivatives thereof as described in U.S. Pat. No. 5,935,721, distyrylarylene derivatives as described in U.S. Pat. No. 5,121,029, and benzazole derivatives, for example, 2,2',2"-(1,3,5-phenylene)tris[1-phenyl-1H-benzimidazole]. Carbazole derivatives are particularly useful hosts for phosphorescent emitters.

Useful fluorescent dopants include, but are not limited to, derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl) methane compounds, and carbostyryl compounds.

Preferred thin film-forming materials for use in forming electron-transporting layer 214 of the organic layers 210 of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

In some instances, emissive layer 213 and electron-transporting layer 214 can optionally be replaced by a single layer that serves the function of supporting both light emission and electron transportation. It is also known in the art that emitting dopants can be added to the hole-transporting layer 212, which can serve as a host. Multiple dopants can be added to one or more layers in order to produce a white-emitting OLED, for example, by combining blue- and yellow-emitting materials, cyan- and red-emitting materials, or red-, green-, and blue-emitting materials. White-emitting devices are described, for example, in EP 1 187 235; U.S. Patent Application Publication 2002/0025419 A1; EP 1 182 244; and U.S. Pat. Nos. 5,683,823; 5,503,910; 5,405,709; and 5,283,182. As shown in commonly assigned EP 1187235 A2, a white-emitting organic EL media can be achieved by the inclusion of the following layers: a hole-injecting layer 211; a hole-transporting layer 212 that is disposed over hole-injecting layer 211 and is doped with a rubrene compound for emitting light in the yellow region of the spectrum; an emissive layer 213 doped with a blue-light-emitting compound disposed over hole-transporting layer 212; and an electron-transporting layer 214 disposed over emissive layer 213. Alternate embodiments where one or more different materials are used in organic layers 210 for different pixels can also be applied to the present invention.

Additional layers such as electron- or hole-blocking layers as taught in the art can be employed in devices of this invention. Hole-blocking layers are commonly used to improve efficiency of phosphorescent emitter devices, for example, as in U.S. Patent Application Publication 2002/0015859 A1.

The organic materials above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551; 5,851,709; and 6,066,357), and inkjet method (U.S. Pat. No. 6,066,357).

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

OLED devices of this invention can employ various well known optical effects in order to enhance its properties if desired. This includes, but is not limited to, optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display.

Figure 4:
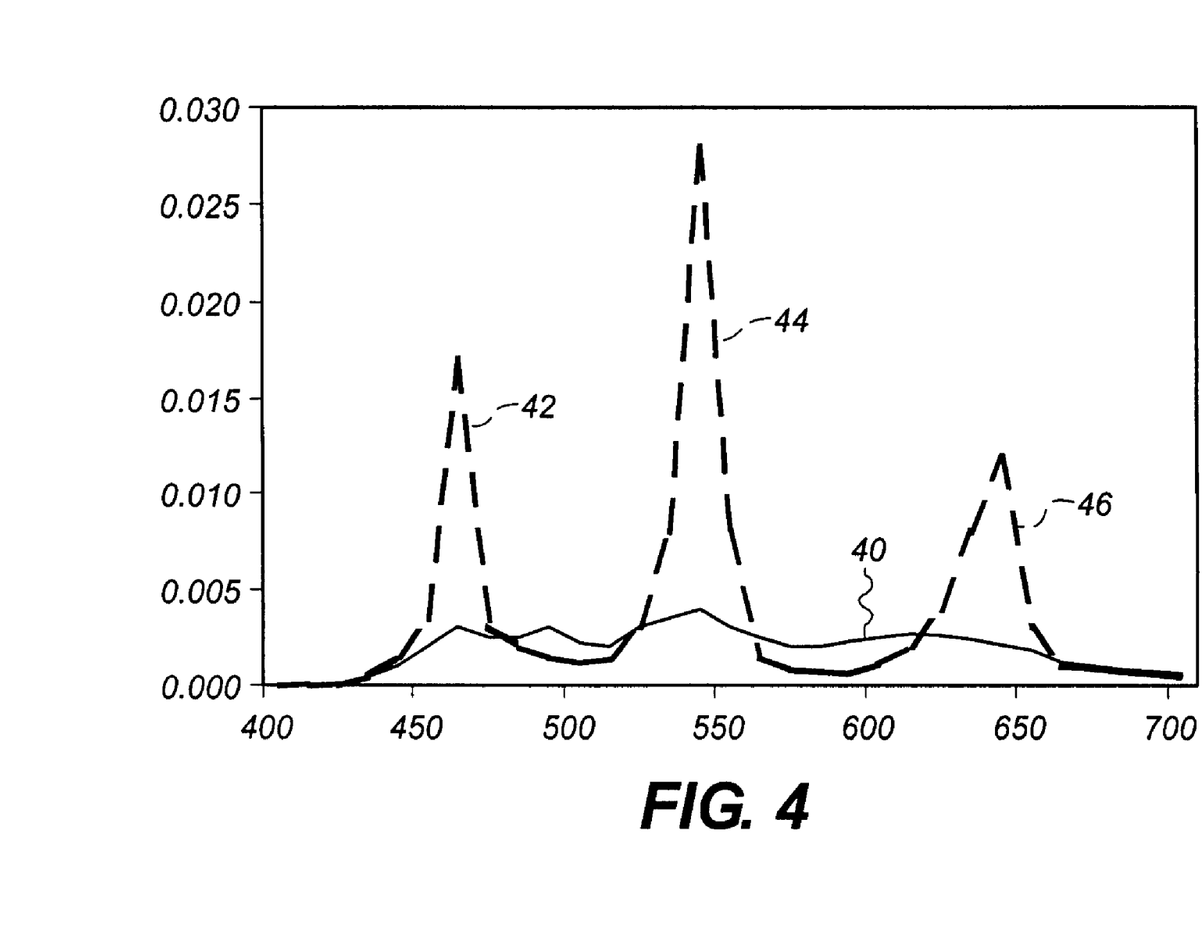
FIG. 4 shows a spectrum of emission after multimode microcavity enhancement vs. a non-enhanced white-emitting OLED device.

Turning now to FIG. 4, there is shown a spectrum of emission after multimode microcavity enhancement vs. a non-enhanced white-light-emitting OLED device. Spectrum 40 is an emission spectrum for a white-light-emitting OLED device without microcavity enhancement. While a specific curve is shown, it will be recognized that any spectrum that includes red, green, and blue components can be utilized. The use of a multimode microcavity such as that in pixel 21d will enhance certain wavelengths of the spectrum to form e.g., multiple resonant peaks 42, 44, and 46.

Figure 5:
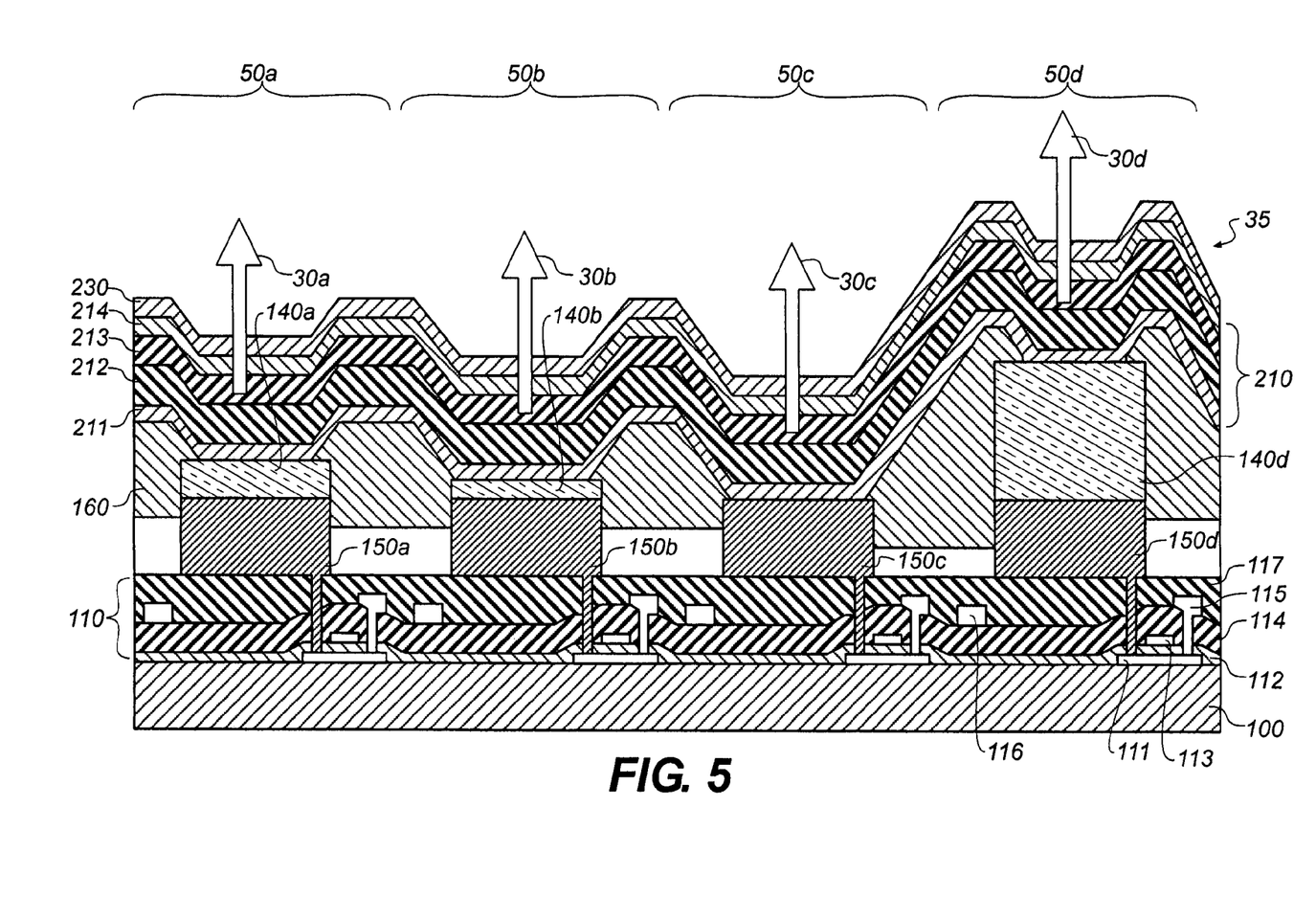
FIG. 5 depicts a cross-sectional view of an array of light-emitting pixels according to another embodiment of the present invention.

FIG. 5 shows a cross-sectional view of an array of light-emitting pixels according to another embodiment of the present invention. OLED device 35 is top-emitting, that is, light (30a, 30b, 30c, and 30d) is emitted in the direction away from substrate 100. OLED device 35 is similar to OLED device 25, except that the positions of reflector and semitransparent reflector are reversed. Each pixel includes a reflector over substrate 100 (e.g. reflectors 150a in pixel 50a, 150b in pixel 50b, 150c in pixel 50c, and 150d in pixel 50d), which functions to form the bottom of a microcavity. Semi-transparent reflector 230 forms the top of the microcavity for all pixels. This permits a portion of light to be emitted from the top of OLED device 35. Reflector 150d and semitransparent reflector 230 also function as electrodes, and it is an advantage of this invention that a highly conductive top electrode can be used in a top-emitting device without the need to pattern that electrode. However, other embodiments can be envisioned wherein the reflectors and the electrodes are separate entities. In other aspects, OLED device 35 functions as OLED device 25 described above.

Figure 6:
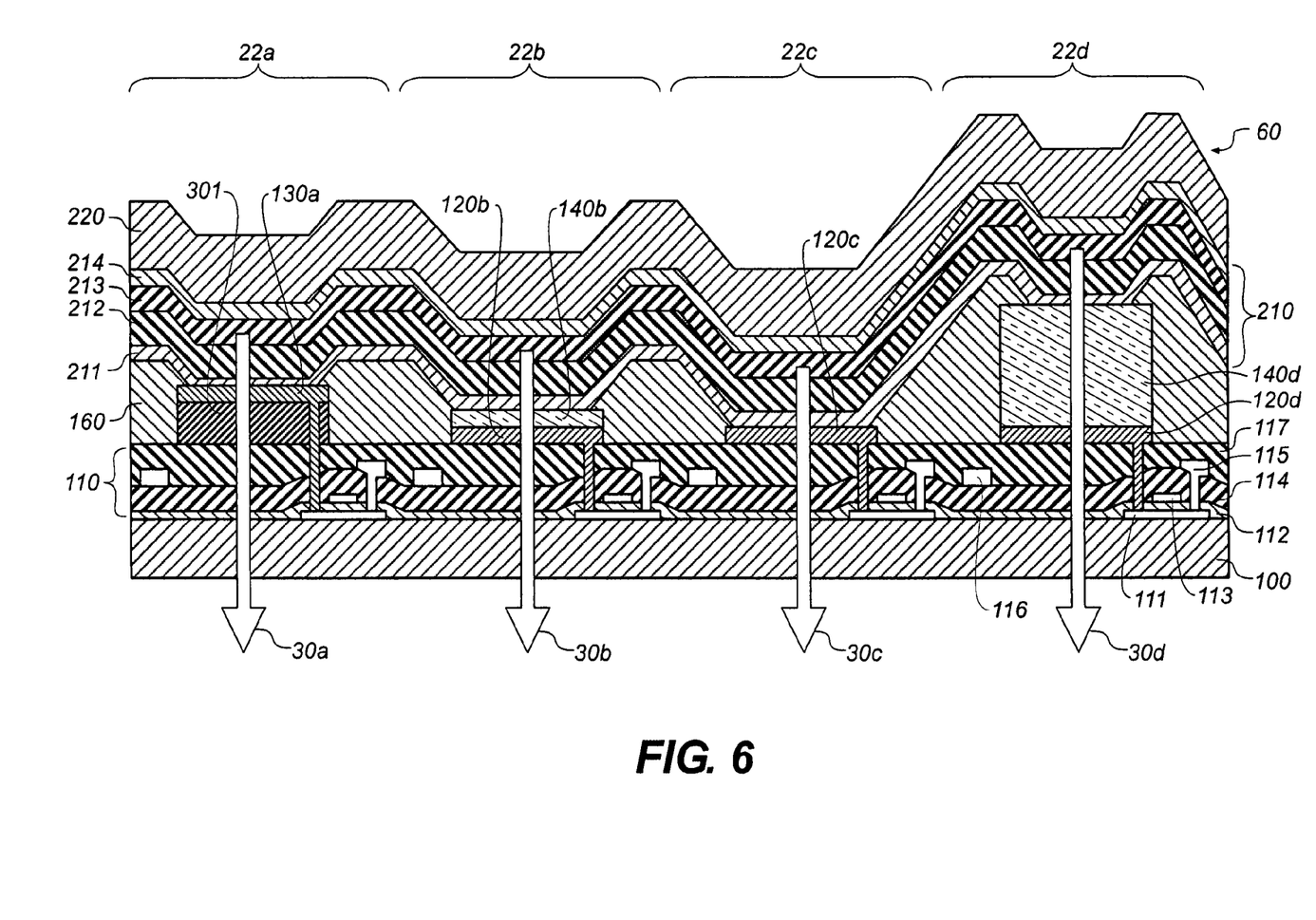
FIG. 6 depicts a cross-sectional view of an array of light-emitting pixels according to another embodiment of the present invention.

The embodiments described above illustrate examples where the efficiency and lifetime of all the color-gamut-defining pixels have been improved by using microcavities. Other embodiments are possible whereby only some of the color-gamut-defining pixels are improved by using a microcavity structure. That is, some of the color-gamut-defining pixels are not constructed as to form a microcavity. FIG. 6 shows an example of such a configuration wherein OLED device 60 has two microcavity color-gamut-defining pixels 22b and 22c, one non-microcavity color-gamut-defining pixel 22a, and a fourth pixel 22d, which can be color-gamut-defining or within-gamut as defined above. In this case, non-microcavity color-gamut-defining pixel 22a is formed using a reflector 220 and a transparent electrode 130a. If organic layers 210 are white- or broadband-emitting, then a color filter 301 can be used to achieve the desired gamut color for these pixels. By color filter, it is meant any material that is capable of converting light of one wavelength range into light of a different wavelength range. These can include traditional color filters, which only pass a narrow range of wavelengths, and therefore can convert broadband or white light into a specific color, e.g. green. For the purposes of this invention, color filters also include color change materials (also known as color change modules) such as fluorescent absorber/re-emitters, which absorb light of a relatively narrow range of wavelengths (e.g. blue light) and re-emit it as light of a different range of wavelengths (e.g. green light). Such materials are well known in the art. As long as any within-gamut pixels are constructed as a microcavity in the case that includes at least one within-gamut pixel, or any one of the pixels is constructed as a microcavity in the case wherein all of the pixels are color-gamut-defining, then some improvement in lifetime and efficiency of the OLED device will be realized according to the present invention. There can be advantages in forming one or more pixels without a microcavity. Microcavities tend to have narrow viewing angles, and it can be desirable to have a portion of an OLED device with a wider viewing angle.

As described above, in order to reduce the number of deposition steps and patterning steps, one of the color-gamut-defining pixels (e.g. 22a) can be formed without a transparent cavity-spacer layer. Another method to reduce the number of deposition and patterning steps is to use the same material, thickness, and refractive index to form one of the transparent cavity-spacer layers, for example, transparent cavity-spacer layer 140b, and the transparent electrodes of the non-microcavity pixels, for example transparent electrode 130a.

Figure 7:
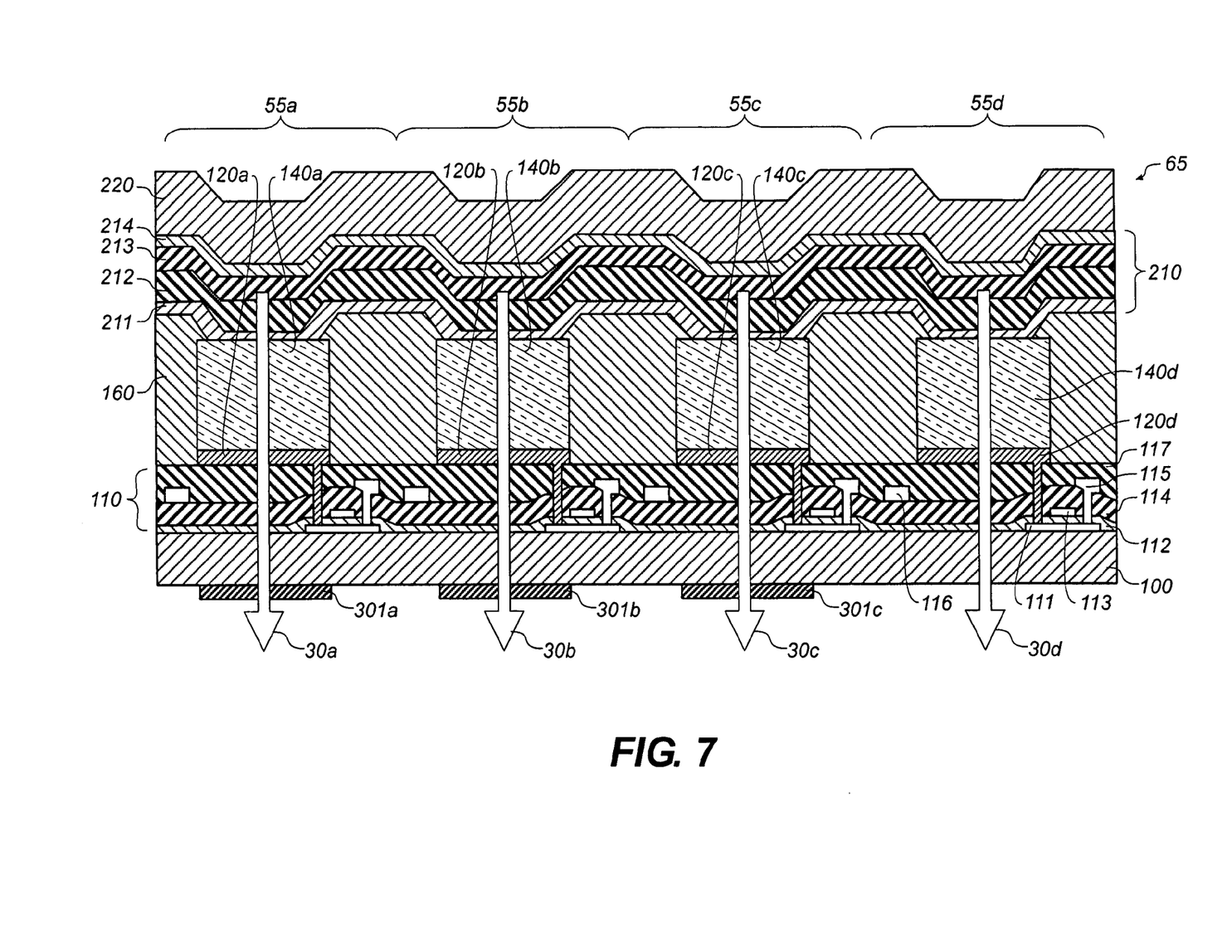
FIG. 7 depicts a cross-sectional view of an array of light-emitting pixels according to another embodiment of the present invention.

Turning now to FIG. 7, there is shown a cross-sectional view of another embodiment of an array of light-emitting pixels according to this invention. OLED device 65 includes organic layers 210, including at least one emissive layer 213 that produces light, spaced electrodes, and an array of at least four pixels 55a, 55b, 55c, and 55d, which produce light of different colors. OLED device 65 can be an active matrix device (as shown) or a passive matrix device, and can be bottom-emitting as shown, or top-emitting. Pixels 55a, 55b, and 55c are color-gamut-defining pixels, as defined above. Pixel 55d can be a within-gamut pixel, or it can be a color-gamut-defining pixel. Color-gamut-defining pixels 55a, 55b, and 55c have a different color filter 301a, 301b, and 301c, respectively, associated with each. Each color filter is a different color, e.g. red, green, and blue. Pixel 55d can optionally have a color filter (not shown) as well, so that each pixel can have a different color filter. While the color filters are shown below substrate 100, it will be understood that they can be located elsewhere, e.g. between the semi-transparent reflectors 120 (such as 120a) and substrate 100.

Each of the pixels in this embodiment includes a reflector 220 and a semitransparent reflector, e.g. semitransparent reflector 120a for pixel 55a, and is a multimode microcavity. The reflector and semitransparent reflector function in this embodiment as electrodes, but other embodiments can be envisioned wherein the reflectors and electrodes are separate entities. If necessary, a transparent cavity-spacer layer (e.g. 140a for pixel 55a) is included.

Each microcavity enhances certain wavelengths of light as described above. The color filter selects the desired color of emitted light for that pixel. For example, if color filter 301a is a red filter, it will permit resonant peak 46 of FIG. 4 to pass, but will block resonant peaks 42 and 44. Similarly, if color filter 301b is a green color filter and color filter 301c is a blue color filter, then pixels 55a, 55b, and 55c will define a color gamut as shown in FIG. 1.

In this embodiment, it is most effective that organic layers 210 produce broadband emission (e.g. white) and are common to all the pixels. This limits the need to pattern organic layers 210 and permits the microcavity structure and the color filters to select the desired wavelength of light for a given pixel.

If pixel 55d is a within-gamut pixel, it can be constructed with or without a color filter. The most common use of a within-gamut pixel 55d will be for making an RGBW device, that is, wherein the colors produced by color-gamut-producing pixels 55a, 55b, and 55c will be red, green, and blue, and the color produced by within-gamut pixel 55d will be white. Pixel 55d can be left unfiltered so as to emit the combination of enhanced red, green, and blue light, thereby providing a white-light-emitting pixel. However, those skilled in the art will realize that such an enhancement by a multimode microcavity will not always provide an ideally-balanced white, and therefore an optional color filter can be used to improve the color balance of pixel 55d.

If pixel 55d is a color-gamut-defining pixel, it can be constructed with or without a color filter, but the use of a color filter can be advantageous. If the multimode microcavity produces more than three resonant peaks, a color filter associated with pixel 55d can permit certain desired wavelengths to pass, producing a colored pixel which extends the color gamut, as shown by emitter 17 in FIG. 1B.

Although all of the transparent cavity-spacer layers 140a through 140d are shown the same size, this invention is not limited to that. The thickness of each transparent cavity-spacer layer, or the refractive index of each transparent cavity-spacer layer, or both, can be separately adjusted for each differently colored pixel in conjunction with the thickness and refractive index of the organic layers to tune the microcavities to desired colors. For example, pixels 55a, 55b, and 55c can have a multimode cavity of a proper thickness and refraction index to enhance red, green, and blue light. Color filters 301a, 301b, and 301c then select the desired color for emission. Pixel 55d can have a multimode microcavity of a proper thickness and refraction index to enhance different wavelengths, one of which can be e.g., yellow. A color filter (not shown) associated with pixel 55d can select yellow emission, providing a fourth color-gamut-defining pixel, which can extend the normal color gamut of an OLED device. This technique can be used with one or more of pixels 55a to 55d. In an alternate embodiment, all but one of the pixels can include a transparent cavity-spacer layer wherein the thickness of each transparent cavity-spacer layer, or the refractive index of each transparent cavity-spacer layer, or both, can be separately adjusted for each differently colored pixel in conjunction with the thickness and refractive index of the organic layers to tune the microcavities to desired colors. The remaining pixel can be tuned to the desired color by selecting the thickness and refractive index of organic layers 210.

Although this invention has been shown to be effective in the case of broadband-emitting organic layers 210 that are common to all pixels, it can also be used in the structure wherein one or more of the organic layers 210 are separately patterned for one or more of the color-gamut-defining pixels. That is, the pixel that one desires to be red-emitting will be patterned with a red-emitting organic layer, the pixel that one desires to be green-emitting will be patterned with a green-emitting organic layer, etc. Such structures are well known in the art. In such a case, a relatively broad emission in e.g. the red region of the spectrum can be enhanced by a microcavity to be a much narrower emission. This improved color purity can be more effective in forming combinations of colors in a full color display.

Figure 8:
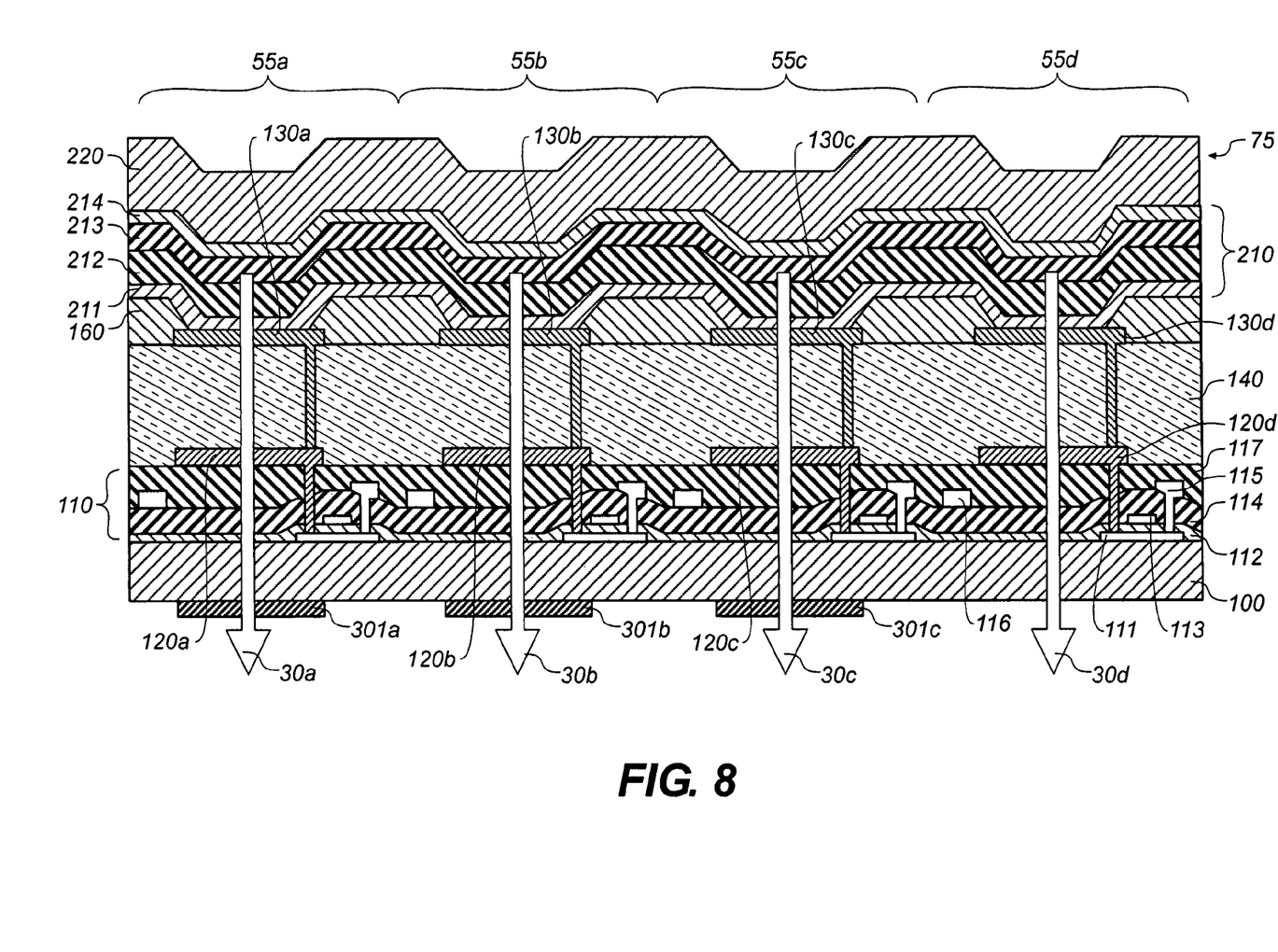
FIG. 8 depicts a cross-sectional view of an array of light-emitting pixels according to another embodiment of the present invention.

Turning now to FIG. 8, there is shown a cross-sectional view of another embodiment of an array of light-emitting pixels according to this invention. OLED device 75 includes many of the features of OLED device 65. However, since the transparent cavity-spacer layers in OLED device 65 are the same thickness, OLED device 75 uses a transparent cavity-spacer layer 140 that is common to several pixels, and can be common to all pixels. Such an arrangement requires that the transparent cavity-spacer layer 140 comprises a transparent non-conducting material, such as silicon oxides ($SiO_x$), silicon nitrides ($Si_xN_y$), silicon oxynitrides ($Si_xO_yN_z$), or transparent polymer materials. OLED device 75 must also include a way of conducting current across the non-conducting transparent cavity-spacer layer 140. Transparent electrodes 130a, 130b, 130c, and 130d, connected through the corresponding semitransparent reflector can do this.

The invention has been described in detail with particular reference to certain preferred embodiments thereof, but it will be understood that variations and modifications can be effected within the spirit and scope of the invention.

PARTS LIST

10 CIE color space
12 red emitter
13 green emitter
14 blue emitter
15 desired color
16 color gamut
17 cyan emitter
18 white emitter
19 color gamut
20a group of pixels
20b group of pixels
20c group of pixels
20d group of pixels
21a pixel
21b pixel
21d pixel
22a pixel
22b pixel
22c pixel
22d pixel
22d pixel
25 OLED device
30a light
30b light
30c light
30d light
35 OLED device
40 spectrum
42 resonant peak
44 resonant peak
46 resonant peak
50a pixel
50b pixel
50c pixel
50d pixel
55a pixel
55b pixel 55c pixel
55d pixel
60 OLED device
65 OLED device
75 OLED device
100 substrate
110 active matrix circuitry
111 semiconductor active layer
112 gate dielectric
113 gate conductor
114 first insulating layer
115 power line
116 signal line
117 second insulating layer
120a semitransparent reflector
120b semitransparent reflector
102c semitransparent reflector
120d semitransparent reflector
130a transparent electrode
130b transparent electrode
130c transparent electrode
130d transparent electrode
140 transparent cavity-spacer layer
140a transparent cavity-spacer layer
140b transparent cavity-spacer layer
140d transparent cavity-spacer layer
150a reflector
150b reflector
150c reflector
150d reflector
160 interpixel dielectric layer
210 organic layers
211 hole-injecting layer
213 hole-transporting layer
213 emissive layer
214 electron-transporting layer
220 reflector
230 semitransparent reflector
301 color filter
301a color filter
301b color filter
301c color filter

The invention claimed is:

1. An OLED device comprising:
 a) an array of light-emitting pixels having organic layers, including at least one emissive layer that produces light and spaced electrodes, and wherein at least three pixels produce colors which define a color gamut and at least one pixel produces light within the color gamut; and
 b) wherein the at least one pixel within the color gamut includes a reflector and a semitransparent reflector which function to form a multimode microcavity.

2. The OLED device of claim 1 wherein one or more of the color-gamut-defining pixels further comprise a reflector and a semitransparent reflector which function to form a microcavity.

3. The OLED device of claim 2 wherein the colors produced by the color-gamut-defining pixels are red, green and blue, and the color produced by the within-gamut pixel is white.

4. The OLED device of claim 2 wherein the reflector also functions as an electrode for at least one of the pixels.

5. The device of claim 2 wherein the semitransparent reflector also functions as an electrode for one or more of the pixels.

6. The OLED device of claim 1 wherein the organic layers produce broadband emission and are common to all the pixels.

7. The OLED device of claim 1 wherein at least one of the color-gamut-defining pixels further comprises a color filter element.

8. The OLED device of claim 1 wherein the device is a passive matrix device.

9. The OLED device of claim 1 wherein the device is an active matrix device.

10. The OLED device of claim 1 wherein the at least one within-gamut pixel further includes a transparent cavity-spacer layer.

11. The OLED device of claim 2 wherein the pixels having a reflector and semitransparent reflector further include a transparent cavity-spacer layer, wherein the thickness of the transparent cavity-spacer layer, refractive index of the transparent cavity-spacer layer, or both, are separately adjusted for each differently colored pixel in conjunction with the thickness and refractive index of the organic layers to tune the microcavities to the desired colors.

12. The OLED device of claim 2 wherein all but one of the pixels having a reflector and semitransparent reflector further include a transparent cavity-spacer layer, wherein the thickness of the transparent cavity-spacer layer, refractive index of the transparent cavity-spacer layer, or both, are separately adjusted for each differently colored pixel in conjunction with the thickness and refractive index of the organic layers to tune the microcavities to the desired colors.

13. The OLED device of claim 1 wherein one or more of the organic layers are separately patterned for one or more of the pixels.

14. The OLED device of claim 1 wherein the device is bottom-emitting.

15. The OLED device of claim 1 wherein the device is top-emitting.

16. An OLED device comprising:
 a) an array of light-emitting pixels having organic layers, including at least one emissive layer that produces light and spaced electrodes, and wherein at least three pixels produce colors which define a color gamut and at least one pixel produces light within the color gamut;
 b) a different color filter associated with each of the color-gamut-defining pixels; and
 c) wherein each pixel is a multimode microcavity and includes a reflector and a semitransparent reflector.

17. The OLED device of claim 16 wherein all of the pixels have different color filters.

18. The OLED device of claim 16 wherein the colors produced by the color-gamut-defining pixels are red, green, and blue, and the color produced by the within-gamut pixel is white.

19. The OLED device of claim 16 wherein the reflector also functions as an electrode for at least one of the pixels.

20. The device of claim 16 wherein the semitransparent reflector also functions as an electrode for one or more of the pixels.

21. The OLED device of claim 16 wherein the organic layers produce broadband emission and are common to all the pixels.

22. The OLED device of claim 16 wherein the device is a passive matrix device.

23. The OLED device of claim 16 wherein the device is an active matrix device.

24. The OLED device of claim 16 wherein the at least one within-gamut pixel further includes a transparent cavity-spacer layer.

25. The OLED device of claim 16 wherein the pixels further include a transparent cavity-spacer layer, wherein the thickness of the transparent cavity-spacer layer, refractive index of the transparent cavity-spacer layer, or both, are separately adjusted for each differently colored pixel in conjunction with the thickness and refractive index of the organic layers to tune the microcavities to the desired colors.

26. The OLED device of claim 16 wherein one or more of the organic layers are separately patterned for one or more of the pixels.

27. The OLED device of claim 16 wherein the device is bottom-emitting.

28. The OLED device of claim 16 wherein the device is top-emitting.

* * * * *